United States Patent [19]

Thackeray et al.

[11] Patent Number: 5,079,131
[45] Date of Patent: * Jan. 7, 1992

[54] METHOD OF FORMING POSITIVE IMAGES THROUGH ORGANOMETALLIC TREATMENT OF NEGATIVE ACID HARDENING CROSS-LINKED PHOTORESIST FORMULATIONS

[75] Inventors: James W. Thackeray, Braintree; Andrew W. McCullough, Brighton, both of Mass.

[73] Assignee: Shipley Company Inc., Newton, Mass.

[ * ] Notice: The portion of the term of this patent subsequent to May 1, 2007 has been disclaimed.

[21] Appl. No.: 653,992

[22] Filed: Feb. 11, 1991

Related U.S. Application Data

[63] Continuation of Ser. No. 237,862, Aug. 29, 1988, abandoned.

[51] Int. Cl.$^5$ .......................... G03C 5/00; G03C 5/16
[52] U.S. Cl. .................................. 430/326; 430/313; 430/327; 430/330; 430/325; 156/628
[58] Field of Search ............... 430/325, 327, 330, 313, 430/326; 156/628

[56] References Cited

U.S. PATENT DOCUMENTS

| | | | |
|---|---|---|---|
| 4,357,369 | 11/1982 | Kilichowski et al. | 427/90 |
| 4,396,704 | 8/1983 | Taylor | 430/311 |
| 4,426,247 | 1/1984 | Tamamura et al. | 156/643 |
| 4,430,153 | 2/1984 | Gleason et al. | 156/643 |
| 4,433,044 | 2/1984 | Meyer et al. | 430/271 |
| 4,552,833 | 11/1985 | Ito et al. | 430/325 |
| 4,613,398 | 9/1986 | Chiong et al. | 156/628 |
| 4,810,601 | 3/1989 | Allen et al. | 430/18 |
| 4,921,778 | 5/1990 | Thackeray et al. | 430/326 |

FOREIGN PATENT DOCUMENTS

| | | | |
|---|---|---|---|
| 164248 | 12/1985 | European Pat. Off. | 430/326 |
| 44715 | 3/1986 | Japan . | |

OTHER PUBLICATIONS

Visser et al, "Mechanism and Kinetics of Silybation of Resist Layers . . . ", Proceedings of SPIE, vol. 771, 1987, p. 1-7.

*Primary Examiner*—Charles L. Bowers, Jr.
*Assistant Examiner*—Christopher G. Young
*Attorney, Agent, or Firm*—Ernest V. Linek; Robert L. Goldberg

[57] ABSTRACT

The present invention is directed to negative cross-linking photoresist formulations containing nonphotoactive cross-linking agents, such as, but not limited to, the CYMEL 300 series, and to the use of these formulations specifically for the dry development of the so-treated resists as positive tone images following their vapor phase treatment with suitable organometallic materials, e.g., HMDS.

31 Claims, 3 Drawing Sheets

FIG. I

METHOD OF FORMING POSITIVE IMAGES THROUGH ORGANOMETALLIC TREATMENT OF NEGATIVE ACID HARDENING CROSS-LINKED PHOTORESIST FORMULATIONS

This is a continuation of copending application Ser. No. 7/237,862 filed on 8/29/88, now abandoned.

BACKGROUND OF THE INVENTION

The present invention is directed to a method of adding organometallic reagents to the surface of photoresists, thereby allow pattern transfer of micron and submicron dimension patterns and fine lines to the substrate below.

Many of the recent advancements in electronic devices and components have resulted from improvements in manufacturing techniques. Some of the most important improvements have occurred in microlithography and in methods of transferring the patterns used to create the complex structures within the electronic devices.

One of the preferred methods of transferring patterns of micron and submicron dimensions is dry etching. This method utilizes plasma or reactive ion etching to remove specific areas of material on a surface so that a pattern remains. In many instances, this method of pattern transfer has replaced older processes which used solvent development of a material to create the pattern. These wet processing techniques frequently did not permit the dimensional control desired in the creation of micron and submicron dimensional patterns.

Typically, the material to be dry etched to create a pattern is a polymeric material for reasons of ease of use, material properties and cost considerations. When an organic polymer is used, dry etching can be done using an oxygen plasma or oxygen reactive ion etching.

During oxygen plasma and/or oxygen reactive ion etching, the organic content of a polymer is converted to a gaseous form which is easily removed. In order to create the desired pattern, there must be some areas of the polymeric material which are made resistant to the etching materials, and other areas which are not reactive therewith.

One method of producing such an etch-resistant polymeric material is to utilize a polymeric resist material containing silicon in a sufficiently large quantity so that exposure to oxygen plasma, for example, results in formation of silicon oxides, which form a protective layer and prevent the conversion of the polymer to its gaseous form.

Examples of silicon-containing copolymers, comprising a compound containing an acrylate moiety and a silicon containing oxime ester of methacrylic acid, which act as a positive resist and which can be dry developed are disclosed in U.S. Pat. No. 4,433,044 to Meyer et al.

A method of selectively removing a portion of a layer of material on a substrate by oxygen plasma etching, utilizing a mask of resist material comprising a poly (silane sulfone) copolymer is disclosed in U.S. Pat. No. 4,357,369 to Kilichowski et al. A method of producing solid state devices by dry etching of a resist film comprising a silicon-containing or nonsilicon-containing but organometallic monomer-containing polymer is described in U.S. Pat. 4,396,704 to Taylor.

Another method for forming a micropattern using a technique similar to those set forth above is disclosed in U.S. Pat. No. 4,430,153 to Gleason et al. The method involves forming an etch barrier in the reactive ion etching of an aromatic polyamic acid/imide polymer.

Another method for forming a micropattern using a technique similar to those above is disclosed in U.S. Pat. No. 4,426,247 to Tamamura et al.

Recently, processes have been developed which permit selective conversion of portions of a non-silicon-containing resist to a silicon-containing etch-resistant resist. The non-silicon-containing resist is exposed to patterned radiation to create a latent image within the resist. Examples of this method of obtaining dry-developable multilayer resists are described in U.S. Pat. No. 4,552,833.

In U.S. Pat. No. 4,613,398 to Chiong et al., there is described a method for producing oxygen etch-resistant polymeric films which incorporate a protective oxide-forming metal permeated into the polymer. These films are useful as positive tone resist patterns for use with dry development techniques.

The present invention represents yet another advance in this art.

SUMMARY OF THE INVENTION

The present invention is directed to negative cross-linking photoresist formulations containing non-photoactive cross-linking agents, such as, but not limited to, melamine resins manufactured by American Cyanamid Company and sold as a series of resins under the trademark CYMEL 300, and to the use of these formulations specifically for the dry development of the so-treated resists as positive tone images following their vapor phase treatment with suitable organometallic materials.

Vapor phase treatment of the modified resist formulation with suitable organometallic materials according to the process of the present invention is accomplished in one embodiment, by the vapor phase exposure of the resist formulation to an organometallic species such as hexamethyl disilazane (HMDS). This compound is representative of one preferred class of organometallic materials useful herein; namely a monofunctional metalating compound (MMC).

In another preferred embodiment, a bifunctional metalating compound (BMC) such as dimethyl dichloro silane (DMDCS) would also provide the substantial advantages afforded by the present invention.

As used herein, a monofunctional metalating compound (MMC) is an organometallic species characterized by having one reactive site per metal for reaction with the resist polymer backbone. Correspondingly a bifunctional metaling compound (BMC) has two reactive sites per metal for reaction with the resist polymer backbone. Also useful herein would be trifunctional metalating compounds (TMC).

By following the teachings of the present invention using these preferred organometallic species, the skilled artisan will readily recognize that many other organometallic materials will also be useful in the process of the present invention.

When an actinically exposed negative cross-linked resist, such as an acid hardened resist available from Shipley Company Inc. of Newtown, Mass., undergoes its normal post exposure bake it produces both cross-linked areas and areas not cross-linked. It has been discovered that organometallic materials such as those in the BSC class and the MSC class, will not react with the cross-linked areas of the resist.

Thus, if an exposed resist is not developed traditionally, but is instead treated in accordance with the present invention with a suitable organometallic species, such as a BSC, metalation (e.g., silylation) will occur only in the unexposed (and hence not cross-linked) areas and not in the exposed or cross-linked areas of the AHR or similar negative cross-linking resist system.

It has been further discovered that this metalation occurs exclusively in the unexposed portions of the resist. Unlike other methods, this method allows for complete differentiation in metalation between the exposed and unexposed areas.

Exposure of this metalated layer to a conventional oxygen etch results in the removal of the non-metalated areas. Thus, in the preferred embodiment described herein, an AHR negative resist has been converted to a positive resist.

Two preferred embodiments will be addressed in conjunction with the present invention. In both Process A, where the exposure is after vapor phase treatment with a suitable organometallic material, and Process B, where the exposure is prior to vapor phase treatment with a suitable organometallic material, the present invention affords useful materials which suffice to generate dry developable images.

DETAILED DESCRIPTION OF THE PREFERRED EMBODIMENTS

As set forth above, the present invention is directed to novel photoresist formulations containing cross-linking agents for use in the dry development of the resist following the vapor phase treatment with an organometallic material thereof.

For instance, an actinically exposed AHR (acid hardened resist) system such as that resist available from Shipley Company Inc. as its EXP-8798 resist undergoes a normal post exposure bake and produces areas of cross-linking and areas without cross-linking.

Treatment of this cross-linked resist with a suitable organometallic material, such as an MSC, causes metalation (e.g., silylation) to occur in the unexposed (and hence not cross-linked) areas but not in the exposed, i.e., areas previously cross-linked.

As the skilled artisan will readily recognize, this is entirely a surface effect (to about 2000 Angstrom depth) with all the concomitant advantages thereof.

Treatment of the partially silylated resist in a conventional oxygen etching system causes the removal of the non-silylated areas of the resist. The advantages of this process are that (1) the resist system is now positive and (2) the remaining layer is now strippable in normal strippers unless exposed to high temperature. Any thermal flow of the final stencil can be eliminated by a suitable post bake at the penalty of less strippability.

Figure 1:
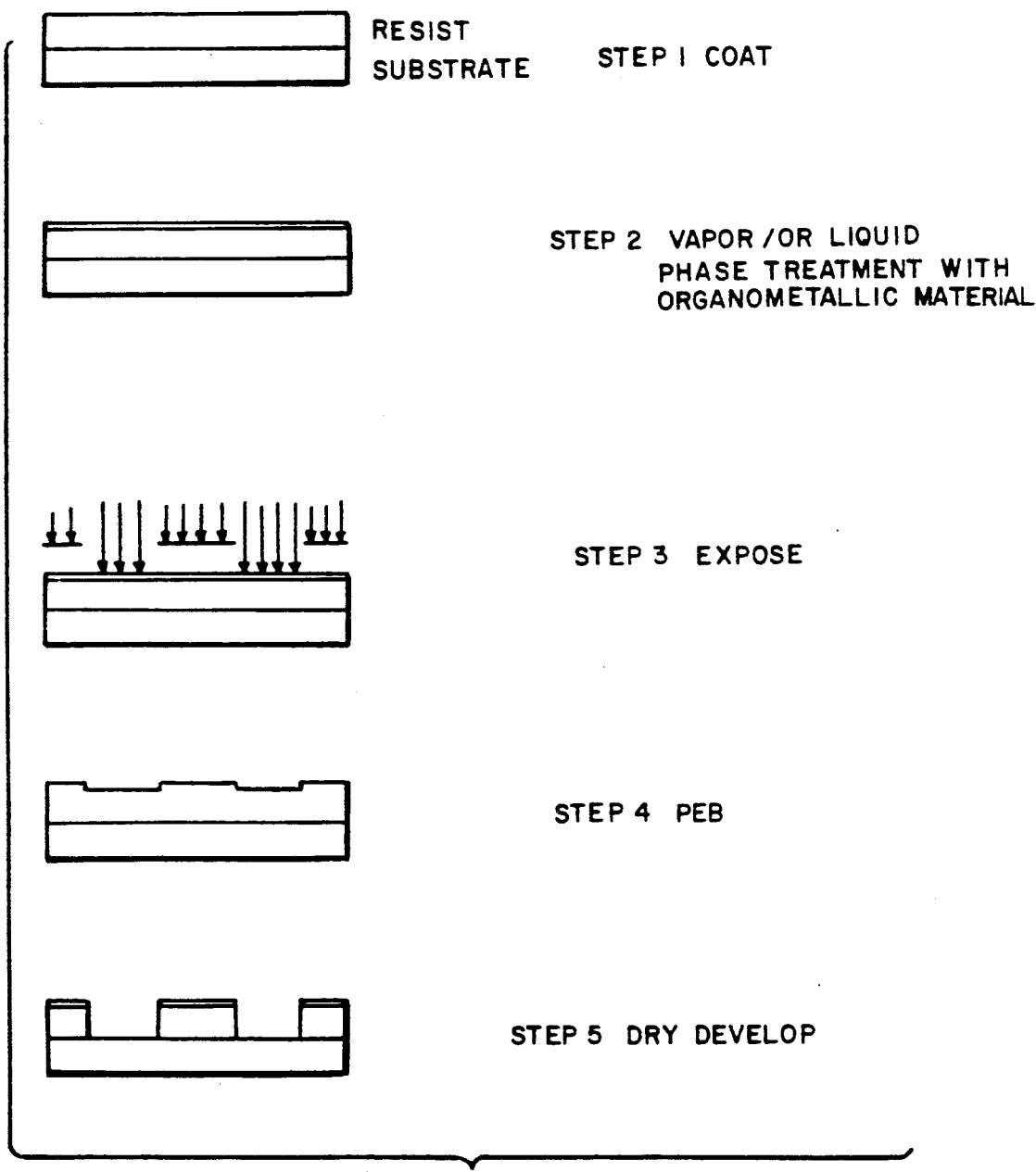
FIG. 1 illustrates schematically one preferred embodiment of the present invention (Process A) wherein vapor phase treatment with an organometallic material occurs prior to exposure of the resist.
Figure 2:
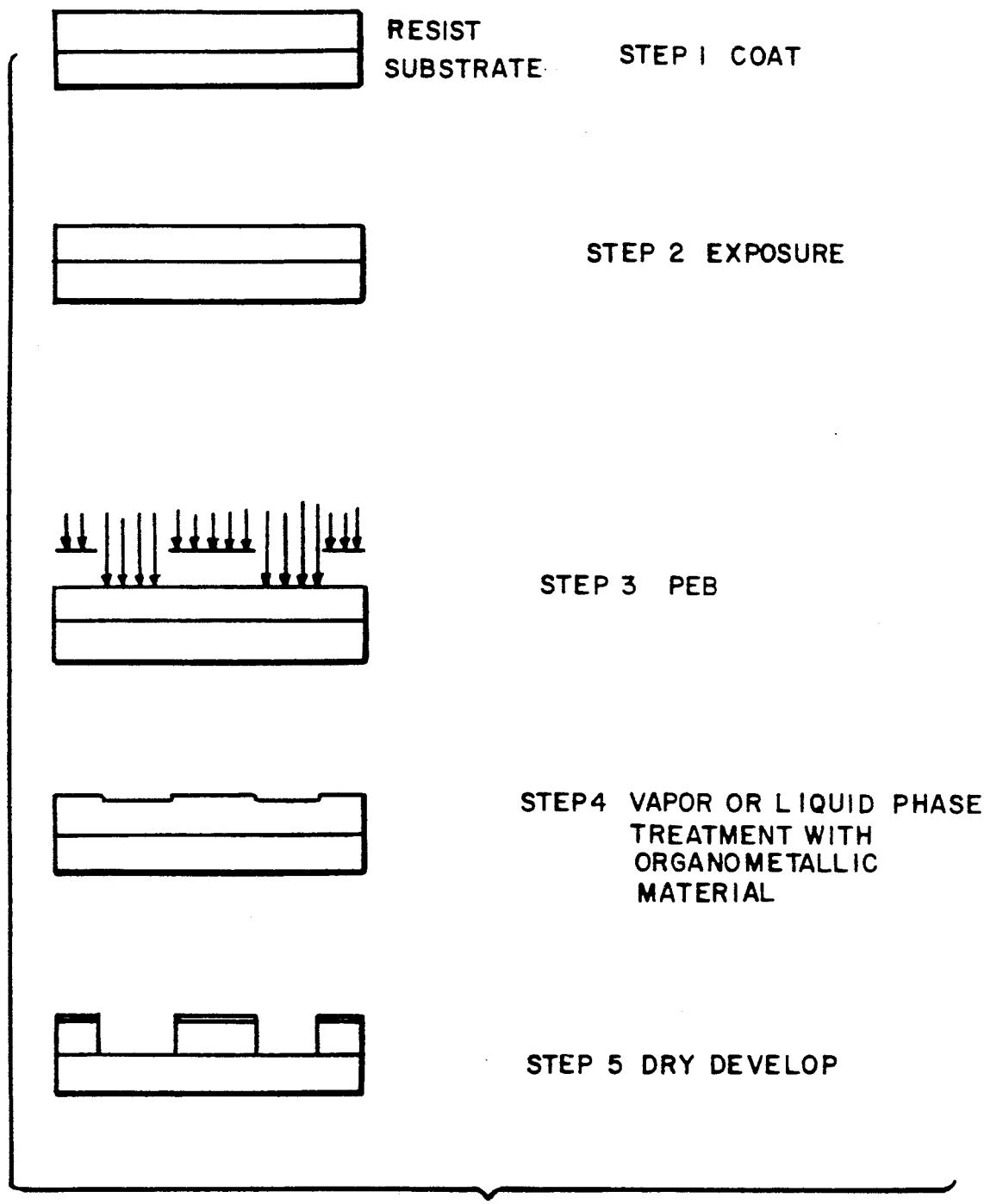
FIG. 2 illustrates schematically another preferred embodiment of the present invention (Process B) wherein vapor phase treatment with an organometallic material occurs after exposure of the resist.

Referring to the Figures accompanying this disclosure, it will be appreciated that both FIG. 1, i.e., Process A, where the exposure is after metalation, and FIG. 2, i.e., Process B, where the exposure is prior to metalation (i.e., treatment with a suitable organometallic material) will suffice to generate dry developable images.

While the drawings call specifically for one preferred metalation (i.e., silylation) it is to be understood that this is merely illustrative of the presently most preferred embodiment, and that the alternative metalation processes, i.e., treatments involving the use of other suitable organometallic compounds, will be readily adopted by the skilled artisan upon consideration of the process schemes outlined in the drawings accompanying this disclosure.

The two illustrated processes have successfully been reduced to practice by the modification of two novel photoresist formulations. These modified formulations, when subjected to the processing conditions illustrated for both Process A and Process B, generated the desired imagery upon dry development.

As illustrated in FIG. 1, in Process A a substrate is first coated with a resist formulation containing at least one cross-linking compound (e.g., CYMEL melamine resin). A uniform layer of silylation is formed as in Step 2, typically by vapor phase deposition. Exposure of the silylated resist to actinic radiation through a mask produces strong acid in the exposed areas which deprotects only the trimethyl silyl group in the exposed areas. The CYMEL melamine resin then cross-links the exposed area when postexposure baked. The post exposure bake also drives out hexamethyl disiloxane, the by-product of hydrolysis.

As illustrated in FIG. 2, Process B involves the same first step as Process A, followed immediately by an exposure step. This exposure step is followed by a post exposure bake which allows the cross-linking agent (e.g. CYMEL melamine resin) to cross the exposed areas. Treatment of the exposed/baked resist film with hexamethyl disilazane (HMDS) affords a selective penetration of silicon into the unexposed areas due to the lack of sites available for silylation in the cross-linked (i.e., the exposed) areas, and/or the inability of the organometallic material to diffuse into the cross-linked areas.

Dry development of the resulting partially silylated resist film using a conventional oxygen etch system, affords the desired pattern, a positive tone image.

As a suitable organometallic material employed herein, the skilled artisan will readily recognize that in addition to HMDS, numerous other organometallic compounds of this type are available for use herein.

One preferred group of such compounds are the tetra-substituted organometallic species. These compounds have the generic formula:

$$R_1R_2R_3R_4-M$$

wherein;

M is selected from the group consisting of Si, Sn, Ti, P, Ge, and Zr, preferably Si; and the organic substituents $R_1$-$R_4$ are each independently selected from the group consisting of alkyl, preferably $C_1$-$C_{16}$, more preferably $C_1$-$C_{10}$, most preferably, $C_1$-$C_6$; aryl, preferably phenyl or alkyl substituted phenyl; and a suitable leaving group such as halogen, preferably Cl, Br, or I.

Similarly, substituted organometallic amine species such as;

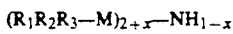

wherein;

X = 0 or 1;

M is selected from the group consisting of Si, Sn, Ti, Ge, and Zr, preferably Si; and the organic substituents $R_1$-$R_3$ are each independently selected from the group consisting of alkyl, preferably $C_1$-$C_{16}$, more preferably $C_1$-$C_{10}$, most preferably, $C_1$-$C_6$; and aryl, preferably phenyl, alkyl substituted phenyl;

may be used herein.

As described above, the most preferred compound of this type, HMDS, which is more completely known as 1,1,1,3,3,3-hexamethyldisilazane, has the formula:

In addition to cross-linking agents such as the CYMEL 300 series, the resist formulations of the present invention may have other ingredients as well. Two commonly employed ingredients in AHR systems are the photoacid generator compounds (PAGs) and photoacid components (PACs).

One especially preferred class of PACs are the diazonaphthoquinone sulfonic acid compounds of the type:

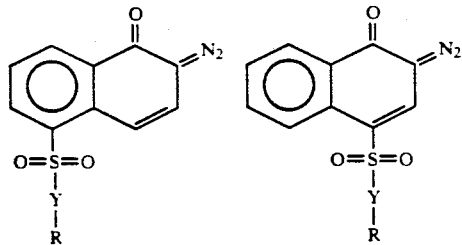

wherein:

Y = O or N; and R is selected from the group consisting of alkyl, preferably $C_1$-$C_{16}$, more preferably $C_1$-$C_{10}$, most preferably, $C_1$-$C_6$; and aryl, preferably phenyl, alkyl substituted phenyl.

One especially preferred resist formulation of the present invention contains CYMEL 300 melamine resin, (p-vinyl) phenol and as a photoacid generator, a halogenated aromatic compound of the formula:

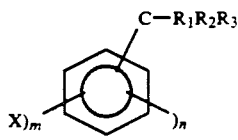

wherein:

X = Cl, Br, F, or I;

n is an integer from 1 to 10 inclusive;

m is an integer from 1 to 10 inclusive; and the organic substituents $R_1$-$C_3$ are each independently selected from the group consisting of alkyl or aryl groups.

Another preferred resist formulation of the present invention contains CYMEL 300 melamine resin, (poly(p-vinyl) phenol and a photoacid generator consisting of halogenated aromatic compounds of the formula:

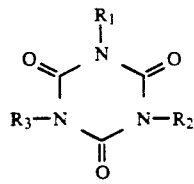

wherein:

the substituents $R_1$-$R_3$ are each independently selected from the group consisting of hydrogen, and halogenated (F, Br, Cl, I) alkyl groups. An especially preferred PAG of this type is tris(2,3-dibromopropyl)-isocyanurate.

After mixing the various ingredients in a suitable solvent, the resist formulation is first spin coated and pre-baked.

In one preferred embodiment of the method of the present invention, the AHR film is first subjected to a thin film treatment by a suitable organometallic compound, i.e., by vapor phase or liquid phase treatment of the film with the organometallic compound, which reacts with at least the first 2000 Angstroms thickness of polymer backbone comprising the film. The remaining thickness of the resist film stays unreacted.

This thin-film reacted resist film is next exposed with deep UV irradiation through a pattern mask. In the exposed areas, strong acids are produced which cause the hydrolysis of the organometallic species (e.g., deprotection of the trimethylsilyl group in the case of HMDS) from the polymeric film resin backbone. This leads to break down of the etch mask character of the film in the exposed areas after appropriate post exposure heat treatment.

Dry development of the baked resist causes break down of the etch mask character in the exposed areas.

In a second preferred embodiment of the present invention, the resist film described above, is exposed with deep UV radiation prior to the step when the organometallic compound is reacted therewith.

The present invention will be further illustrated with reference to the following examples which will aid in the understanding of the present invention, but which is not to be construed as a limitation thereof. All percentages reported herein, unless otherwise specified, are percent by weight. All temperatures are expressed in degrees Celsius.

EXAMPLE 1

A positive tone resist pattern was obtained in the following manner:

A polymeric resist material comprising a mixture of 5.0 g of a photoacid generator (PAG), such as tris(2,3-dibromopropyl) - isocyanurate, 3.0 g of a commercially available cross-linker, CYMEL 300 melamine resin, and 20 g of a novolak resin, such as m-cresol novolak, was formulated with a standard photoresist solvent, such as, propylene glycol or monomethyl ether acetate.

The resist was dispensed in 2.0 ml quantities on a 75 mm wafer. The coatings were 0.6 micron after softbake at 80° C. for 60 seconds on a hot plate. The wafers were then exposed on an HTG deep UV contact printer with energies of 10 to 50 mJ/cm². These wafers were then postexposure baked at 100° C. for 2 minutes.

The exposed wafers were then silylated on a Monarch 150 silylation apparatus at 80 torr Hexamethyl Disilazane (HMDS), 125°, for 35 seconds.

The wafers were then dry developed in a Plasma Technologies O₂ reactive ion etcher for 2 minutes under the conditions of 20 cc. O₂, 20 mtorr pressure, 100 Watts bias. Two micron lines were resolved, with a positive tone image. There was 0.4 micron resist retained.

EXAMPLE 2

Figure 3:
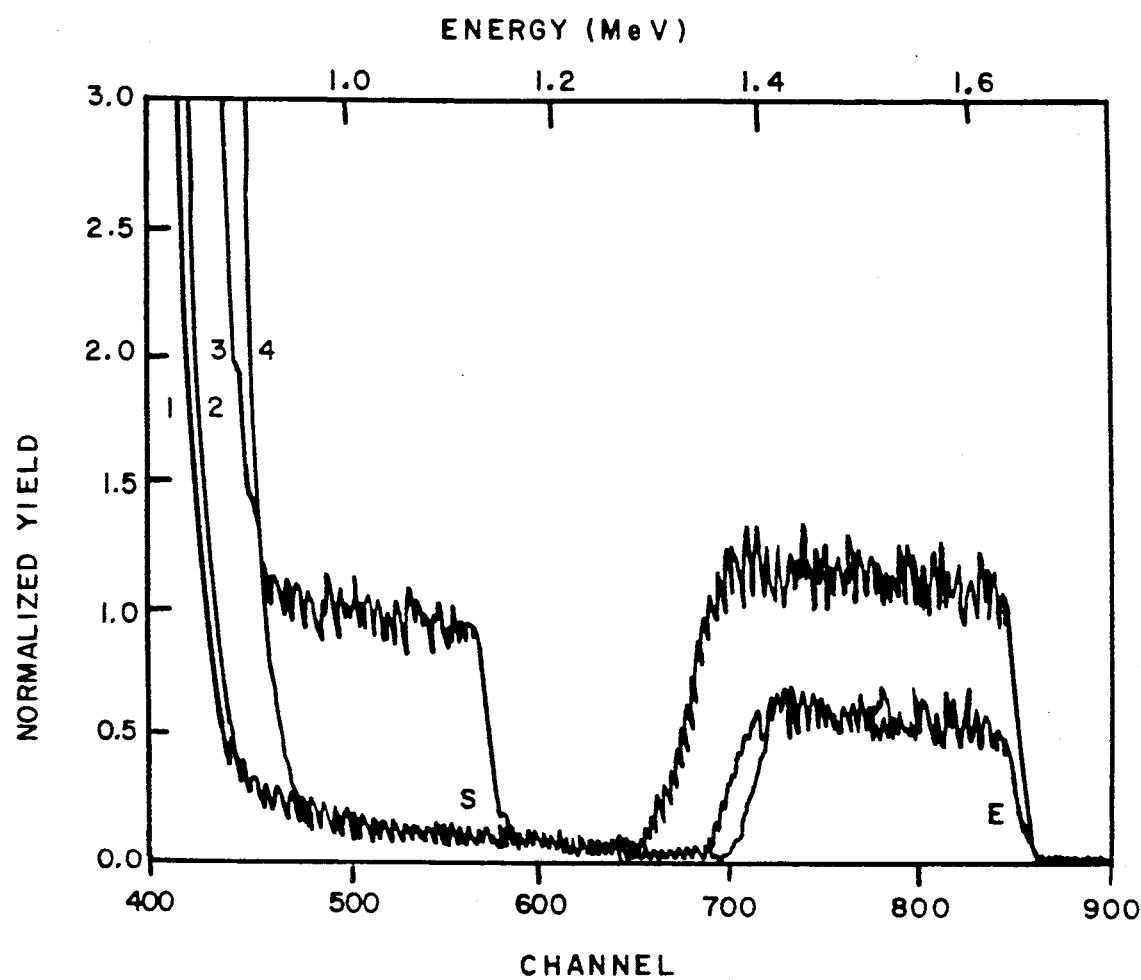
FIG. 3 is a Rutherford Backscattering Spectrometry scan illustrating the presence and lack of silicon in selected areas of resists.

FIG. 3 is provided as absolute proof of the selectivity of the process of the present invention.

The analytical technique illustrated is called Rutherford Backscattering Spectrometry (RBS). RBS detects the elemental constituents as well as their distribution in the resist film thickness (resolution=30 Angstrom).

Four samples are shown (Curves 1-4). Curve 1 is an unexposed control sample that has not been treated with silylation. Curve 2 is an exposed control sample. Neither curve 1 nor curve 2 contain surface silicon.

The peaks at 860 channel number are bromine and correspond to the PAG in the resist. Note, bromine is uniformly distributed throughout the film, in all four cases. However, surface silicon only shows up at 580 channel number for curve 3, an unexposed, silylated resist formulation. Curve 4 corresponds to the exposed, crosslinked part of the same wafer which has absolutely no surface silicon.

The present invention has been described in detail, including the preferred embodiments thereof. However, it will be appreciated that those skilled in the art, upon consideration of the present disclosure, may make modifications and/or improvements on this invention and still be within the scope and spirit of this invention as set forth in the following claims.

What is claimed is:

1. A method of forming a patterned layer on a substrate comprising:
   (a) coating the substrate with a polymeric negative acid hardening cross-linking photoresist composition containing one or more nonphotoactive cross-linking agents and one or more photoacid generators;
   (b) drying the coating to form a resist film;
   (c) exposed selected portions of the coated film with a source of radiation, thereby producing acids in the exposed areas of the film;
   (d) baking the exposed film to cross-link the exposed areas and to remove sites capable of reacting with an organometallic reagent;
   (e) treating the baked resist film with a uniform thin layer of an organometallic reagent which is selectively enriched in the non-cross-linked, unexposed areas of the resist film; and
   (f) dry developing the resist film so as to remove the resist in the exposed, cross-linked areas, affording a positive image formation.

2. The method of claim 1, wherein the polymeric materials in the photoresist composition are selected from the group consisting of poly(p-vinyl)-phenols, the novolak resins, polyvinyl pyrollidones, and mixtures thereof.

3. The method of claim 1, wherein the photoacid generator is a halogenated aromatic compounds of the formula:

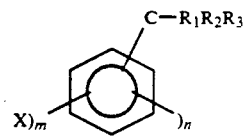

wherein:
X=Cl, Br, F, or I;
n is an integer
m is an integer from 1 to 10 inclusive; and
the organic substituents $R_1$-$R_3$ are each independently selected from the group consisting of alkyl or aryl groups.

4. The method of claim 3, wherein the organic substituents $R_1$-$R_3$ are each independently $C_1$-$C_{16}$ alkyl groups.

5. The method of claim 3, wherein the organic substituents $R_1$-$R_3$ are each independently $C_1$-$C_{10}$ groups.

6. The method of claim 3, wherein the organic substituents $R_1$-$R_3$ are each independently $C_1$-$C_6$ groups.

7. The method of claim 3, wherein the organic substituents $R_1$-$R_3$ are each independently phenyl or alkyl substituted phenyl.

8. The method of claim 1, wherein the photoacid generator is a halogenated aromatic compounds of the formula:

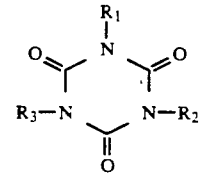

wherein:
the substituents $R_1$-$R_3$ are each independently selected from the group consisting of hydrogen, and halogenated (F, Br, Cl, I) alkyl groups.

9. The method of claim 8, wherein the halogenated alkyl groups are each independently $C_1$-$C_{16}$ alkyl groups.

10. The method of claim 8, wherein the halogenated alkyl groups are each independently $C_1$-$C_{10}$ groups 11. The method of claim 8, wherein the halogenated alkyl groups are each independently $C_1$-$C_6$ groups.

12. The method of claim 1, wherein the organometallic compound is selected from the compounds having the formula:

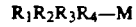

$$R_1R_2R_3R_4-M$$

wherein;
M is selected from the group consisting of Si, Sn, Ti, P, Ge, and Zr; and
the organic substituents $R_1$-$R_4$ are each independently selected from the group consisting of alkyl, aryl, and a suitable leaving group, with the proviso that one such substituent is a leaving group.

13. The method of claim 12, wherein M is Si.

14. The method of claim 12, wherein up to three of the organic substituents $R_1$-$R_4$ are each independently selected from the group consisting of $C_1$-$C_{16}$ alkyl.

15. The method of claim 12, wherein up to three of the organic substituents $R_1$-$R_4$ are each independently selected from the group consisting of $C_1$-$C_{10}$ alkyl.

16. The method of claim 12, wherein up to three of the organic substituents $R_1$-$R_4$ are each independently selected from the group consisting of $C_1$-$C_6$ alkyl.

17. The method of claim 12, wherein up to three of the organic substituents $R_1$-$R_4$ are each independently selected from the group consisting of phenyl or alkyl substituted phenyl.

18. The method of claim 12, wherein at least one of the leaving groups is a halogen selected from the group consisting of F, Cl, Br, or I.

19. The method of claim 12, wherein at least one of the leaving groups is an amino group of the formula $NR_1R_2$.

20. The method of claim 12, wherein at least one of the leaving groups is an alkoxy group of the formula $OR_1$.

21. The method of claim 1, wherein the organometallic compound is selected from the compounds having the formula:

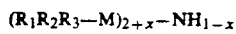

wherein;

$x = 0$ or $1$;

M is selected from the group consisting of Si, Sn, Ti, Ge, and Zr; and the organic substituents $R_1$-$R_3$ are each independently selected from the group consisting of alkyl and aryl.

22. The method of claim 19, wherein M is Si.

23. The method of claim 19, wherein the organic substituents $R_1$-$R_3$ are each independently selected from the group consisting of $C_1$-$C_{16}$ alkyl.

24. The method of claim 19, wherein the organic substituents $R_1$-$R_3$ are each independently selected from the group consisting of $C_1$-$C_{10}$ alkyl.

25. The method of claim 19, wherein the organic substituents $R_1$-$R_3$ are each independently selected from the group consisting of $C_1$-$C_6$ alkyl.

26. The method of claim 19, wherein the organic substituents $R_1$-$R_3$ are each independently selected from the group consisting of phenyl and alkyl substituted phenyl.

27. The method of claim 1, wherein the photoactive compound is selected from compounds having the formula:

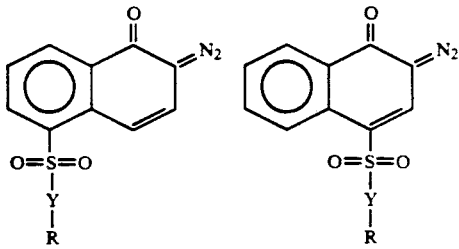

wherein

Y is selected from the group consisting of O, S, N, and C; and

R is selected from the group consisting of alkyl and aryl substituents.

28. The method of claim 25, wherein R is selected from the group consisting of $C_1$-$C_{16}$ alkyl.

29. The method of claim 25, wherein R is selected from the group consisting of $C_1$-$C_{10}$ alkyl.

30. The method of claim 25, wherein R is selected from the group consisting of $C_1$-$C_6$ alkyl.

31. The method of claim 25, wherein R is selected from the group consisting of phenyl and alkyl substituted phenyl.

* * * * *